(12) United States Patent
Li

(10) Patent No.: US 12,113,072 B2
(45) Date of Patent: Oct. 8, 2024

(54) DISPLAY PANEL AND DISPLAY DEVICE

(71) Applicant: Wuhan China Star Optoelectronics Semiconductor Display Technology Co., Ltd., Wuhan (CN)

(72) Inventor: Chao Li, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/605,067

(22) PCT Filed: Sep. 7, 2021

(86) PCT No.: PCT/CN2021/116829
§ 371 (c)(1),
(2) Date: Oct. 20, 2021

(87) PCT Pub. No.: WO2023/019653
PCT Pub. Date: Feb. 23, 2023

(65) Prior Publication Data
US 2024/0055435 A1    Feb. 15, 2024

(30) Foreign Application Priority Data
Aug. 19, 2021    (CN) .......................... 202110956604.3

(51) Int. Cl.
*H10K 50/856*    (2023.01)
*H01L 27/12*    (2006.01)
(Continued)

(52) U.S. Cl.
CPC ....... *H01L 27/1218* (2013.01); *H10K 50/856* (2023.02); *H10K 59/121* (2023.02); *H10K 59/351* (2023.02)

(58) Field of Classification Search
CPC combination set(s) only.
See application file for complete search history.

(56) References Cited

U.S. PATENT DOCUMENTS 10,862,064 B1 * 12/2020 Ting .................... H10K 50/813
2018/0056701 A1 * 3/2018 Nagano ................ G02B 5/1861
(Continued)

FOREIGN PATENT DOCUMENTS

CN    111028692 A    4/2020
CN    111833754 A    10/2020
(Continued)

*Primary Examiner* — Eric K Ashbahian
*Assistant Examiner* — David W Ward
(74) *Attorney, Agent, or Firm* — Nathan & Associates; Menachem Nathan

(57) ABSTRACT

A display panel and a display device are provided. The display panel is provided with a plurality of first pixels and a plurality of first pixel driving circuits located in a main display area, a plurality of second pixels located in a transparent display area and a transition display area, a plurality of second pixel driving circuits located in the transition display area, and a reflector. The second pixel driving circuits form a plurality of driving circuit islands for driving the second pixels. The reflector includes a first reflection portion located on the driving circuit islands so that a reflectivity in the main display area and a reflectivity in the transition display area tend to be identical.

20 Claims, 6 Drawing Sheets

(51) Int. Cl.
*H10K 59/121* (2023.01)
*H10K 59/35* (2023.01)

(56) References Cited

U.S. PATENT DOCUMENTS

2022/0155829 A1* 5/2022 Lou .................... H04N 13/204
2022/0310005 A1* 9/2022 Chen ................... G09G 3/3225
2022/0367587 A1* 11/2022 Li ....................... H10K 59/131

FOREIGN PATENT DOCUMENTS

| CN | 112102783 A | 12/2020 |
| CN | 112259596 A | 1/2021 |
| CN | 112885876 A | 6/2021 |
| CN | 113066842 A | 7/2021 |
| CN | 113140609 A | 7/2021 |
| CN | 213878097 U | 8/2021 |
| EP | 3525064 A1 | 8/2019 |

* cited by examiner

DISPLAY PANEL AND DISPLAY DEVICE

FIELD OF INVENTION

The present disclosure relates to a display technical field, and specifically, to a display panel and a display device.

BACKGROUND OF INVENTION

An organic light emitting diode (AMOLED) display panel uses a transparent display in its camera area under the screen to ensure the imaging effect of the camera area under the screen. A conventional OLED display panel includes a normal display area, a transparent display area, and a transition display area disposed between the normal display area and the transparent display area. Driving circuits of pixels in the transparent display area and signal wirings for connecting the driving circuits are disposed in the transition display area to achieve a display and a high transmittance of the transparent display area. The normal display area is provided with a plurality of array pixels and driving circuits corresponding to the pixels to achieve image display. However, in this design, since the driving circuits for driving light emission of the pixels in the transparent display area and the pixels in the transition display area are gathered to form pixel driving islands, thus there is a significant difference in metal density arrangements between the pixel driving islands in the transition display area and the normal display area, thereby causing a significant difference in reflectivity between the pixel driving islands and the normal display area to affect uniformity of the display.

SUMMARY OF DISCLOSURE

Technical Problem

Embodiments of the present disclosure provide a display panel and a display device to solve a technical problem that display uniformity of the OLED display panel is affected by the significant difference between the reflectivity of the normal display area and that of the driving circuit islands in an existing OLED display panel.

Technical Solutions

To solve above problems, the present disclosure provides the following technical solutions:

One embodiment of the present disclosure provides a display panel, including a main display area, a transparent display area, and a transition display area disposed between the main display area and the transparent display area, wherein the display panel includes:

a plurality of first pixels located in the main display area;
a plurality of second pixels located in the transparent display area and the transition display area;
a plurality of first pixel driving circuits located in the main display area and configured to drive the plurality of first pixels;
a plurality of second pixel driving circuits located in the transition display area and forming a plurality of driving circuit islands for driving the plurality of second pixels; and
a reflector including a plurality of first reflection portions located on the driving circuit islands and a plurality of second reflection portions located in the main display area, a percentage of a unit area of the second reflection portions is A, a percentage of a unit area of the first reflection portions is B, wherein an absolute value of a difference value between A and B is less than or equal to 11.29%; a material of the reflector includes any one of a laminated ITO/Ag/ITO composite film layer, a laminated Ti/Al/Ti composite film layer, and a molybdenum metal layer.

In some embodiments of the present disclosure, a brightness difference between the transition display area and the main display area is less than 0.5%.

In some embodiments of the present disclosure, the transition display area includes a first sub-transition area and a second sub-transition area, the first sub-transition area is disposed between the second sub-transition area and the transparent display area, the second sub-transition area is disposed between the main display area and the first sub-transition area, the second sub-transition area includes a driving circuit island area for providing with the plurality of driving circuit islands, and a non-driving circuit island area between the driving circuit islands; wherein, the reflector further includes a plurality of third reflection portions located in the non-driving circuit island area and a plurality of fourth reflection portions located in the first sub-transition area, a percentage of a unit area of the third reflection portions is C, a percentage of a unit area of the fourth reflection portions is D, wherein an absolute value of a difference value between A and C is less than 2%, an absolute value of a difference value between A and D is less than 2%, and an absolute value of a difference value between C and D is less than 2%.

In some embodiments of the present disclosure, a boundary of the transparent display area close to the first sub-transition area is an arc boundary, a boundary of the first sub-transition area close to the second sub-transition area includes two opposite first arc boundaries, a boundary of the second sub-transition area close to the main display area includes two opposite second arc boundaries, and each of the first arc boundaries has a curvature less than a curvature of each of the second arc boundaries.

In some embodiments of the present disclosure, a pattern of the second reflection portions, a pattern of the first reflection portions, a patten of the third reflection portions, and a pattern of the fourth reflection portions are same as or similar to each other.

In some embodiments of the present disclosure, the plurality of second reflection portions are distributed by equal spacings, the plurality of first reflection portions are distributed by equal spacings, the plurality of third reflection portions are distributed by equal spacings, and the plurality of fourth reflection portions are distributed by equal spacings.

In some embodiments of the present disclosure, the reflector is disposed between the first pixels and the first pixel driving circuits, and between the second pixels and the second pixel driving circuits; at least a part of the second reflection portions electrically connects the first pixel driving circuits and the first pixels; and at least a part of the first reflection portions electrically connects the second pixel driving circuits and the second pixels.

In some embodiments of the present disclosure, the first pixel driving circuit and the second pixel driving circuit include: a first metal layer including a source electrode and a drain electrode of the first pixel driving circuit, and a source electrode and a drain electrode of the second pixel driving circuit;

the first pixel and the second pixel include: an anode layer disposed on the first metal layer, wherein the anode layer forms a first anode and a second anode; wherein, the reflector is disposed between the anode layer and the first metal layer, a part of the second reflection portions of the reflector electrically connects the first anode and the source electrode or the drain electrode of the first pixel driving circuit, and a part of the first reflection portions of the reflector electrically connects the second anode and the source electrode or the drain electrode of the second pixel driving circuit.

One embodiment of the present disclosure further provides another display panel, including a main display area, a transparent display area, and a transition display area disposed between the main display area and the transparent display area, wherein the display panel includes:
- a plurality of first pixels located in the main display area;
- a plurality of second pixels located in the transparent display area and the transition display area;
- a plurality of first pixel driving circuits located in the main display area and configured to drive the plurality of first pixels;
- a plurality of second pixel driving circuits located in the transition display area and forming a plurality of driving circuit islands for driving the plurality of second pixels; and
- a reflector including a plurality of first reflection portions located on the driving circuit islands.

In some embodiments of the present disclosure, the reflector further includes a plurality of second reflection portions located in the main display area, a percentage of a unit area of the second reflection portions is A, a percentage of a unit area of the first reflection portions is B, and an absolute value of a difference value between A and B is less than or equal to 11.29%.

In some embodiments of the present disclosure, a brightness difference between the transition display area and the main display area is less than 0.5%.

In some embodiments of the present disclosure, the transition display area includes a first sub-transition area and a second sub-transition area, the first sub-transition area is disposed between the second sub-transition area and the transparent display area, the second sub-transition area is disposed between the main display area and the first sub-transition area, the second sub-transition area further includes a driving circuit island area for providing with the plurality of driving circuit islands, and a non-driving circuit island area between the driving circuit islands; wherein, the reflector includes a plurality of third reflection portions located in the non-driving circuit island area and a plurality of fourth reflection portions located in the first sub-transition area, a percentage of a unit area of the third reflection portions is C, a percentage of a unit area of the fourth reflection portions is D, wherein an absolute value of a difference value between A and C is less than 2%, an absolute value of a difference value between A and D is less than 2%, and an absolute value of a difference value between C and D is less than 2%.

In some embodiments of the present disclosure, a boundary of the transparent display area close to the first sub-transition area is an arc boundary, a boundary of the first sub-transition area close to the second sub-transition area includes two opposite first arc boundaries, a boundary of the second sub-transition area close to the main display area includes two opposite second arc boundaries, and each of the first arc boundaries has a curvature less than a curvature of each of the second arc boundaries.

In some embodiments of the present disclosure, a pattern of the second reflection portions, a pattern of the first reflection portions, a patten of the third reflection portions, and a pattern of the fourth reflection portions are same as or similar to each other.

In some embodiments of the present disclosure, the plurality of second reflection portions are distributed by equal spacings, the plurality of first reflection portions are distributed by equal spacings, the plurality of third reflection portions are distributed by equal spacings, and the plurality of fourth reflection portions are distributed by equal spacings.

In some embodiments of the present disclosure, the reflector is disposed between the first pixels and the first pixel driving circuits, and between the second pixels and the second pixel driving circuits, at least a part of the second reflection portions electrically connects the first pixel driving circuits and the first pixels, and at least a part of the first reflection portions electrically connects the second pixel driving circuits and the second pixels.

In some embodiments of the present disclosure, the first pixel driving circuit and the second pixel driving circuit include: a first metal layer including a source electrode and a drain electrode of the first pixel driving circuit, and a source electrode and a drain electrode of the second pixel driving circuit; the first pixel and the second pixel include: an anode layer disposed on the first metal layer, wherein the anode layer includes a first anode and a second anode; wherein, the reflector is disposed between the anode layer and the first metal layer, a part of the second reflection portions of the reflector electrically connects the first anode and the source electrode or the drain electrode of the first pixel driving circuit, and a part of the first reflection portions of the reflector electrically connects the second anode and the source electrode or the drain electrode of the second pixel driving circuit.

In some embodiments of the present disclosure, a material of the reflector includes any one of a laminated ITO/Ag/ITO composite film layer, a laminated Ti/Al/Ti composite film layer, and a molybdenum metal layer.

One embodiment of the present disclosure further provides a display device, including a display panel of above embodiments and a photosensitive element, wherein the photosensitive element is disposed correspondingly to a transparent display area of the display panel.

Beneficial Effect:

A plurality of first reflection portions disposed on the driving circuit islands of the pixels in the transition display area of the display panel render the reflectivity in the main display area and the reflectivity at the driving circuit islands of the pixels in the transition display area tend to be uniform, so as to increase the uniformity of the display of the display panel.

DETAILED DESCRIPTION OF PREFERRED EMBODIMENTS

The present application provides a display panel and a display device. For making the object, the technical solutions and the effects more clear and definite, hereinafter, the present application will be further descried in detail with reference to the accompanying drawings and embodiments. It should be understood that the specific embodiments described herein are only used for explaining the present application, and are not intended to limit the present application.

Figure 1:
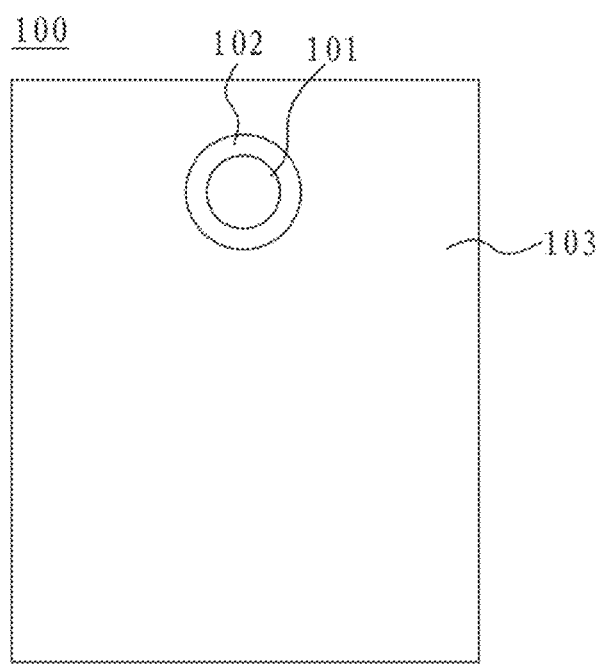
FIG. 1 is a schematic plan view of a display panel provided in one embodiment of the present disclosure.

Referring to FIG. 1, one embodiment of the present disclosure provides a display panel 100, including a main display area 103, a transparent display area 101, and a transition display area 102. The transition display area 102 is disposed between the transparent display area 101 and the main display area 103. The main display area 103 is used for a routine display. The transparent display area 101 has a high transparency while achieving a display so as to allow a light to pass, and thus the main display area 103 has an area significantly greater than an area of the transparent display area 101.

In one embodiment of the present disclosure, the transparent display area 101 may be a round shape, and the transparent display area 101 in other embodiments may also be a square, a rhombus, an ellipse, or other shapes. The transition display areas 102 surrounds the transparent display area 101, the main display area 103 surrounds the transition display areas 102, the transition display area 102 may be a ring shape, specifically a circular ring shape, and in other embodiments the transition display area may also be a square ring shape, or an oval ring shape.

Figure 2:
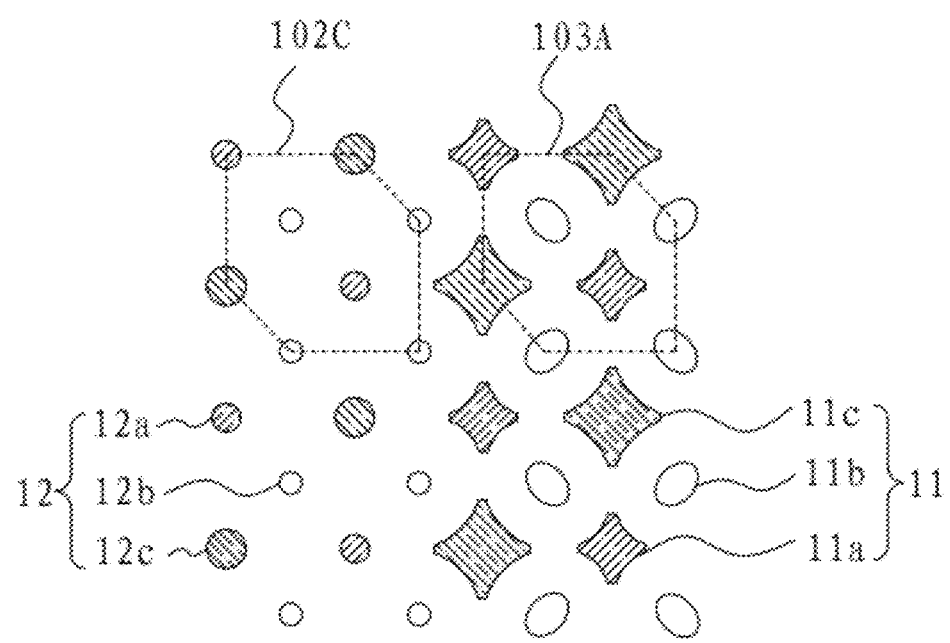
FIG. 2 is a schematic view of the arrangement of pixels at a boundary between a transition display area and a main display area provided in one embodiment of the present disclosure.

Referring to FIG. 2, FIG. 2 is a schematic view of the arrangement of pixels at a boundary between the transition display area and the main display area. The display panel 100 includes a plurality of first pixels 11, and a plurality of second pixels 12. It is characterized that the first pixel 11 is located in the main display area 103, and the second pixel 12 is located in the transition display area 102 and the transparent display area 101. Any one of the first pixels 11 includes a first red sub-pixel 11a, a first green sub-pixel 11b, and a first blue sub-pixel 11c. Any one of the second pixels 12 includes a second red sub-pixel 12a, a second green sub-pixel 12b, and a second blue sub-pixel 12c.

The main display area 103 is provided with a plurality of first pixel repeating units 103A. The transition display area 102 and the transparent display area 101 are provided with a plurality of second pixel repeating units 102C. Within the same area, a number of the first pixel repeating units 103A included in the main display area 103 is the same as a number of the second pixel repeating units 102C included in the transition display area 102 and the transparent display area 101, i.e. the main display area 103 and the transition display area 102 and the transparent display area 101 have the same pixel densities (pixel per inch, PPI) that the entire display difference between the display image of the main display area 103 and the display image of the transition display area 102 and the transparent display area 101 can be reduced.

The arrangement of the first pixel repeating units 103A and the arrangement of the second pixel repeating units 102C are the same, and the arrangement includes the arrangement rule and the arrangement distance of the sub-pixels. The first pixel repeating units 103A and the second pixel repeating units 102C all arrange by means of pentile. For example, the first pixel repeating units 103A are in a 4×4 array arrangement, the adjacent rows of the sub-pixels have a misalignment arrangement, and the adjacent columns of the sub-pixels have a misalignment arrangement. The first pixel repeating units 103A includes two first red sub-pixels 11a, four first green sub-pixels 11b, and two first blue sub-pixels 11c. The first red sub-pixel 11a and the first blue sub-pixel 11c are located at the same rows and sequentially alternated. The first green sub-pixel 11b, the first red sub-pixel 11a, and the first blue sub-pixel 11c are sequentially alternated.

Figure 4:
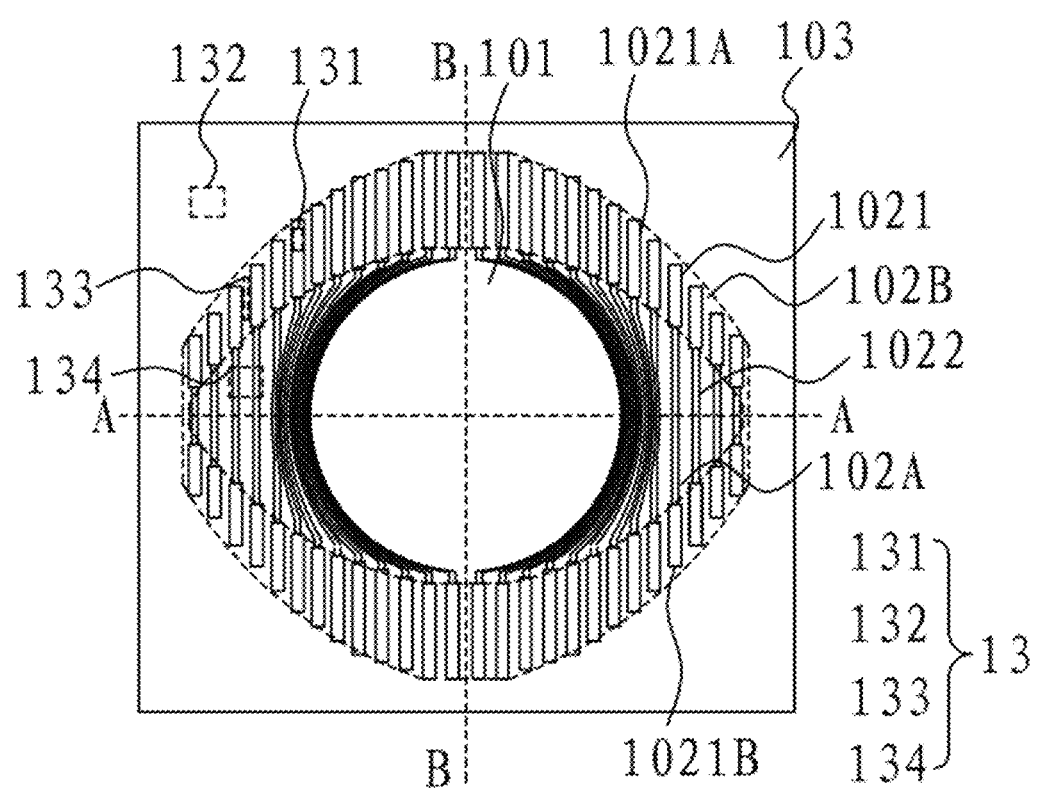
FIG. 4 is a structural schematic view of a transition display area of a display panel provided in one embodiments of the present disclosure.

Furthermore, the display panel further includes a plurality of first pixel driving circuits for driving the plurality of first pixels 11 to emit light, and a plurality of second pixel driving circuits for driving the second pixels 12 to emit light. The plurality of first pixel driving circuit is located in the main display area 103, the plurality of second pixel driving circuit is located in the transition display area 102. To increase the transmittance of the transparent display area 101, the driving circuit of the pixels in the transparent display area 101 is placed in the transition display area 102 so that a part of the second pixel driving circuit in the transition display area 102 drives the pixels in the transparent display area 101 to emit a light, and a part of the second pixel driving circuit drives the pixels in the transition display area 102 to emit a light, thus resulting in a difference between a metal density of the area where the driving circuit in the transition display area 102 is located and a metal density of the main display area 103 is significant, thereby causing a circular ring presented in the transition display area 102 when the display panel 100 display images. Referring to FIG. 4, one embodiment of the present disclosure provides the reflector 13 in the main display area 103 and the transition display area 102, and makes the reflectivity of the transition display area 102 and the reflectivity of the main display area 103 be identical by controlling a distribution density of the reflector in the transition display area 102 and the main display area 103, so that the entire display area has a uniform brightness.

Each sub-pixel in the main display area 103 has an aperture area greater than an aperture area of each of the corresponding sub-pixels in the transition display area 102 and the transparent display area 101. The aperture area of the transition display area 102 is designed to be smaller to provide a larger containing space for the arrangement of the driving circuit.

Figure 3:
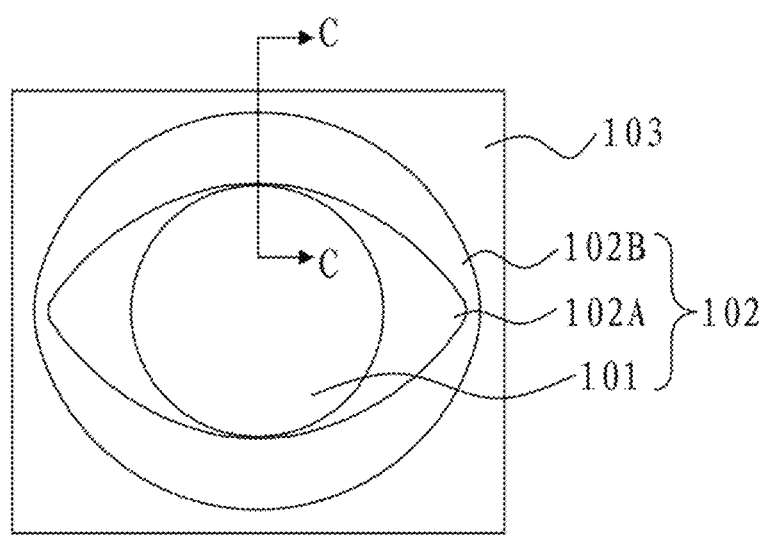
FIG. 3 is a partial enlargement of a schematic view of a display panel provided in one embodiment of the present disclosure.

Referring to FIG. 3 and FIG. 4, the transition display area 102 a plurality of second pixel driving circuits of the transition display area 102 is centralized to form a plurality of driving circuit islands 1021. The reflector 13 includes a plurality of first reflection portions 131 located on the driving circuit island 1021, a plurality of second reflection portions 132 located in the main display area 103. A percentage of a unit area of the second reflection portions 132 is A, and a percentage of a unit area of the first reflection portions 131 is B. The inventors found that when an absolute value of a difference value between A and B is made to be less than or equal to 11.29% by adjusting a difference between the percentages of the unit areas of the first reflection portion 131 and the second reflection portion 132, a difference between the reflectivity of the driving circuit island 1021 and the reflectivity of the main display area 103 can be significantly reduced so that a brightness difference between the transition display area and the main display area is less than or equal to 0.5%. Under this brightness difference, the display uniformity can be achieved. The brightness difference is calculated by a formula of: (brightness in the main display area/brightness of an area where the driving circuit islands are located)−1|.

Referring to FIG. 3 and FIG. 4, further, in one embodiment of the present disclosure, the transition display area 102 includes a first sub-transition area 102A and a second sub-transition area 102B. The first sub-transition area 102A is disposed between the second sub-transition area 102B and the transparent display area 101, and the second sub-transition area 102B is disposed between the main display area 103 and the first sub-transition area 102A.

The second sub-transition area 102B further includes a driving circuit island area and a non-driving circuit island area. The driving circuit island area is used for placing the plurality of driving circuit islands 1021, and the non-driving circuit island area is a region between the driving circuit islands 1021 in the second sub-transition area 102B. The non-driving circuit island area is provided with a first wiring connecting the second pixel driving circuits, and the first wiring may be a scan line. The first wiring may be a straight line or a broken line. A plurality of second wirings may be disposed in the first sub-transition area 102A, such as scan lines, or VDD wirings, for connecting the same rows of the second pixel driving circuits.

One of the second pixel driving circuits can drive a plurality of sub-pixels with same color in the transition display area 102 and the transparent display area 101 to reduce the space occupied by the driving circuit islands 1021. For example, two second red sub-pixels 12a may be driven by the same second pixel driving circuit, four second green sub-pixels 12b may be driven by the same second pixel driving circuit, and two second blue sub-pixels 12c may be driven by the same second pixel driving circuit.

Compared with the second sub-transition area 1028, the first sub-transition area 102A is disposed more close to the main display area 103 to avoid the second wiring 1022 in the first sub-transition area 102A to be routed overlong.

In one embodiment of the present disclosure, a boundary of the transparent display area 101 close to the first sub-transition area 102A is an arc boundary, specifically a circular arc boundary or an oval boundary; a boundary of the first sub-transition area 102A close to the second sub-transition area 1028 includes two opposite first arc boundaries, a boundary of the second sub-transition area 102B close to the main display area 103 includes two opposite second arc boundaries, and each of the first arc boundaries has a curvature less than a curvature of each of the second arc boundaries.

Referring to FIG. 4, the plurality of second pixel driving circuits in the second sub-transition area 1028 form a plurality of driving circuit islands 1021 for driving the plurality of second pixels 12. A plurality of second pixel driving circuits is disposed on any one of the driving circuit islands 1021, the plurality of driving circuit islands 1021 surround the first sub-transition area 102A. The driving circuit islands 1021 may have shapes of bars. The plurality of driving circuit islands 1021 include a first group of driving circuit islands 1021A and a second group of driving circuit islands 1021B. Each second wiring 1022 correspondingly connects one of driving circuit islands 1021 of the first group of driving circuit islands 1021A and one of the driving circuit islands 1021 of the second group of driving circuit islands 1021B.

Further, the first group of driving circuit islands 1021A and the second group of driving circuit islands 1021B are symmetrical about a symmetry axis AA, the first group of driving circuit islands 1021A are symmetrical about a symmetry axis BB, and the second group of driving circuit islands 1021B are symmetrical about the symmetry axis BB.

Referring to FIG. 4, the reflector 13 includes a plurality of second reflection portions 132, a plurality of first reflection portions 131, a plurality of third reflection portions 133, and a plurality of fourth reflection portions 134. The plurality of second reflection portions 132 are located in the main display area 103, the plurality of first reflection portions 131 are located on the plurality of driving circuit islands 1021, the plurality of third reflection portions 133 are located in the non-driving island area between the plurality of driving circuit islands 1021, and the fourth reflection portions 134 are located in the first sub-transition area 102A. By providing the reflection portions in different areas and adjusting the proportions of the reflection portions in each area, the overall reflectivity of the different areas can be made uniform, and the effect of no obvious demarcation can be achieved during display.

In some embodiments of the present disclosure, a percentage of a unit area of the second reflection portions 132 is A, a percentage of a unit area of the first reflection portions 131 is B, the difference value between A and B is greater than 0 or equal to 11.29%. Within this range, a brightness difference between the driving circuit island area and the main display area is less than 0.5%, and the effect of no obvious demarcation between the transition display area 102 and the main display area 103 can be achieved during display.

Further, a percentage of a unit area of the third reflection portions 133, a percentage of a unit area of the fourth reflection portions 134, and a percentage of a unit area of the second reflection portions 132 are as close or equal as possible, so that the brightness of the first sub-transition area 102A, the second sub-transition area 1028, and the main display area 103 tend to be identical to improve the display effect.

Specifically, a percentage of a unit area of the third reflection portions is C, an absolute value of the difference value between A and C is less than 2%; a percentage of a unit area of the fourth reflection portions is D, an absolute value of the difference value between A and D is less than 2%; a percentage of a unit area of the third reflection portion is C, an absolute value of the difference value between C and D is less than 2%. Within such ranges, the brightness difference between the non-driving island area, the first sub-transition area, the transparent display area, and the main display area are all less than 0.5%. The formula of the brightness difference is the same as abovementioned formula: |(brightness of the main display area/brightness of a CUP region)−1|, wherein the CUP region refers to any one of the non-driving island area, the first sub-transition area, and the transparent display area.

The area mentioned in this embodiment refers to the orthographic projection area of each component on the substrate. The percentage of the unit area mentioned in this embodiment refers to the ratio of the area of the reflection portion in a pixel repeating unit area to the area of a pixel repeating unit. For example, the percentage of the unit area of the second reflection portions 132 is equal to a ratio of the area of the second reflection portions 132 in one first pixel repeating unit 103A area to the area of one first pixel repeating unit 103A. The percentage of the unit area of the first reflection portions 131 is equal to a ratio of an area of the first reflection portion 131 in one second pixel repeating unit 102C area to an area of one second pixel repeating unit 102C. Referring to FIG. 2, the percentage of the area of the pixel repeating unit can be calculated by the area occupied by the closed area formed by successively connecting the center points of the sub-pixels on the periphery of a pixel repeating unit. The area occupied by the first pixel repeating unit 103A is the same as the area occupied by the second pixel repeating unit 102C.

In some embodiments of the present disclosure, a pattern of the second reflection portions 132, a pattern of the first reflection portions 131, a pattern of the third reflection portions 133, and a pattern of the fourth reflection portions 134 are all the same as or similar to each other. The patterns of the reflecting parts are designed to tend to be the same, so that the reflection portions can be formed by the same array process when they are prepared on the same layer. The "similar" pattern means that when the pattern has a small difference, and the small difference does not affect the reflectivity of the pattern.

The plurality of second reflection portions 132 are distributed by equal spacings, the plurality of first reflection portions 131 are distributed by equal spacings, the plurality of third reflection portions 133 are distributed by equal spacings, and the plurality of fourth reflection portions 134 are distributed by equal spacings.

The display panel 100 in one embodiment of the present disclosure may be an OLED display panel, and the display panel in other embodiments may also be a Micro-LED display panel, or a Mini-LED display panel.

Figure 5:
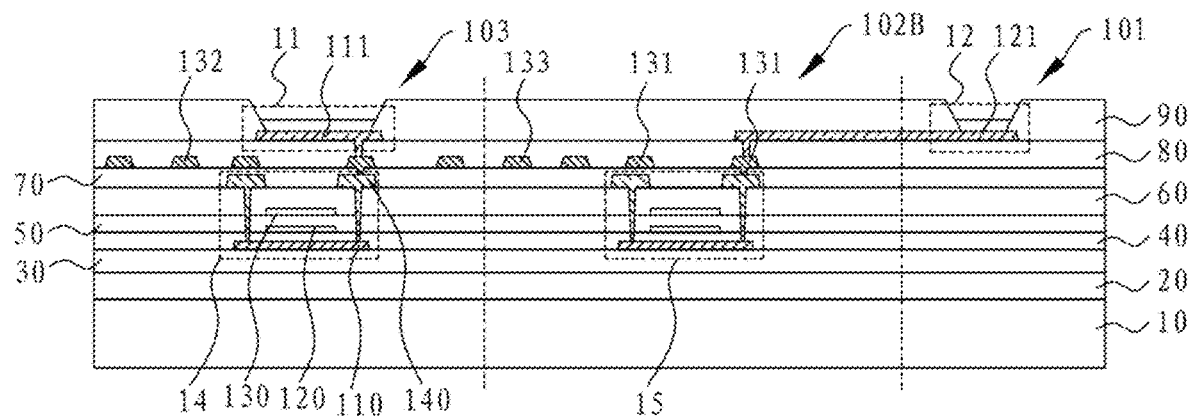
FIG. 5 is a cross-sectional schematic view taken along C-C in FIG. 2.

Referring to FIG. 5, FIG. 5 is a cross-sectionally schematic view taken along C-C in FIG. 2. The reflector 13 is disposed between the first pixel 11 and the first pixel driving circuit 14, and between the second pixel 12 and the second pixel driving circuit 15. At least a part of the second reflection portions 132 electrically connects the first pixel driving circuit 14 and the first pixel 11 to act as a bridge wiring. At least a part of the first reflection portions 131 electrically connects the second pixel driving circuit 15 and the second pixel 12 to act as a bridging wiring. That is, the reflector 13 functions to electrically connect other film layers while adjusting the reflectivity of each area.

The reflector 13 is a patterned conductive metal. The reflector 13 may be a conductive layer of composite metal, such as laminated ITO/Ag/ITO or laminated Ti/Al/Ti, and a conductive layer of single metal, such as molybdenum, is also possible. Each reflection portions of the reflector 13 may be a square, a rhombus, a round shape, an ellipse, a bar, or other shapes.

Referring to FIG. 5, the first pixel driving circuit 14 and the second pixel driving circuit 15 include a first metal layer 140. The first metal layer 140 includes a source electrode and a drain electrode of the first pixel driving circuit, and a source electrode and a drain electrode of the second pixel driving circuit 15. The first pixel 11 and the second pixel 12 include an anode layer disposed on the first metal layer 140. The anode layer includes a first anode 111 and a second anode 121, in which the reflector 13 is disposed between the anode layer and the first metal layer 140. A part of the second reflection portions 132 of the reflector 13 electrically connects the first anode 111 and the source electrode or the drain electrode of the first pixel driving circuit 14. A part of the first reflection portions 131 of the reflector 13 electrically connects the second anode 121 and the source electrode or the drain electrode of the second pixel driving circuit 15.

Specifically, referring to FIG. 5, the display panel 100 includes a substrate 10, an active layer 110 disposed on one side of the substrate 10, a second metal layer 120 disposed on one side of the active layer 110 away from the substrate 10, a third metal layer 130 disposed on one side of the second metal layer 120 away from the active layer 110, a first metal layer 140 disposed on one side of the third metal layer 130 away from the second metal layer 120, a first planarization layer 70 disposed on one side of the first metal layer 140 away from the third metal layer 130, the reflector 13 disposed on one side of the first planarization layer 70 away from the first metal layer 140, a second planarization layer 80 disposed on one side of the reflector 13 away from the first planarization layer 70, a light emitting device layer disposed on one side of the second planarization layer 80 away from the reflector 13, and a pixel definition layer 90 disposed on one side of the second planarization layer 80 away from the reflector 13.

Furthermore, a laminated barrier layer 20 and a buffer layer 30 may be disposed between the active layer 110 and the substrate 10. The buffer layer 30 id disposed on one side of the barrier layer 20 away from the substrate 10. A first insulating layer 40 is disposed between the second metal layer 120 and the active layer 110, a second insulating layer 50 is disposed between the third metal layer 130 and the second metal layer 120, and a third insulating layer 60 is disposed between the first metal layer 140 and the third metal layer 130.

In the above embodiment, the reflector 13 is disposed between a pixel driving circuit (the first pixel driving circuit 14, the second pixel driving circuit 15) film layer and the light emitting device layer (the first pixel 11, the second pixel 12). In other embodiments, the reflector 13 may be disposed on the same layer as the first metal layer 140, and the reflector 13 may also be disposed on the same layer as an anode of the light emitting device layer. The reflector 13 is further disposed on different film layers stacked on top of each other, in which a part is disposed on a film layer, and the other part is disposed on another film layer.

In one embodiment of the present disclosure, the first pixel driving circuit 14 may be a 7T1C configuration, i.e. including seven thin film transistors (TFT) and one storage capacitor. The second pixel driving circuit 15 may be a 7T1C configuration or a 2T1C configuration. In one embodiment of the present disclosure, the described TFT of the pixel driving circuit may be a low temperature polycrystalline silicon TFT, and an amorphous silicon TFT or a metal oxide TFT is also possible in other embodiments.

The active layer 110 is a patterned low temperature polycrystalline layer for forming a semiconductor layer of each TFT, the second metal layer 120 is a patterned metal for forming a gate electrode of the TFT of the first pixel driving circuit 14, a gate electrode of the TFT of the second pixel driving circuit 15, and other signal lines, such as scan lines; the third metal layer 130 is a patterned metal for at least forming an electrode plate of a capacitor of the first pixel driving circuit 14, and an electrode plate of a capacitor of the second pixel driving circuit 15; the first metal layer 140 is a patterned metal for forming at least the source electrode and the drain electrode of the first pixel driving circuit 14, and the source electrode and the drain electrode of the second pixel driving circuit 15, and further for forming other signal lines, such as data lines and power signal lines.

The light emitting device layer may be an organic electroluminescent diode device for forming sub-pixels. The light emitting device layer includes the anode layer, luminescent material functional layer, and the cathode sequentially stacked each other. The anode layer has a patterned structure, including the first anode 111 and the second anode 121 located in the main display area 103. The second anode 121 from the transparent display area 101 extends to the second sub-transition area 102B to electrically connect the corresponding second pixel driving circuit 15 in the second sub-transition area 102B.

A part of the second reflection portions 132 of the reflector 13 electrically connects the first anode 111 of the light emitting device layer and the source electrode or the drain electrode of the first pixel driving circuit 14 through corresponding vias, so as to achieve the electrical connection between the first pixel driving circuit 14 and the first pixel 11. A part of the first reflection portions 131 of the reflector 13 electrically connects the second anode 121 of the light emitting device layer and the source electrode or the drain electrode of the second pixel driving circuit 15 through corresponding vias, so as to achieve the electrical connection between the second pixel driving circuit 15 and the second pixel 12.

Figure 6:
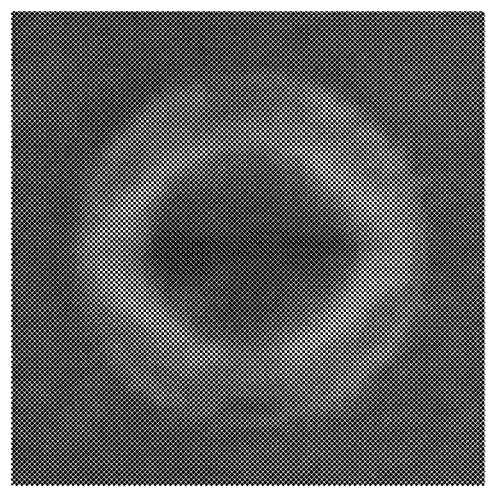
FIG. 6 is a simulated display image before optimizing a density of a second reflection portion and a density of a first reflection portion.

Referring to FIG. 6, FIG. 6 is a stimulated display image before optimizing the density of the second reflection portion and the first reflection portion. Before optimizing, various data are: a percentage of a unit area of the second reflection portion 132 located in the main display area 103 is 55.49%; a percentage of a unit area of the first reflection portion 131 located in the driving circuit island area of the second sub-transition area 102B is 36.99%, a percentage of a unit area of the third reflection portions 133 located in the non-driving island area of the second sub-transition area 102B is 36.99%, a percentage of a unit area of the fourth reflection portions 134 located in the first sub-transition area 102A is 36.99%. From FIG. 6, it can be seen that the ring phenomenon in the first sub-transition area 102A, the second sub-transition area 102B, and the main display area 103 is more serious, and the transition display area 102 has an abnormal display.

Figure 7:
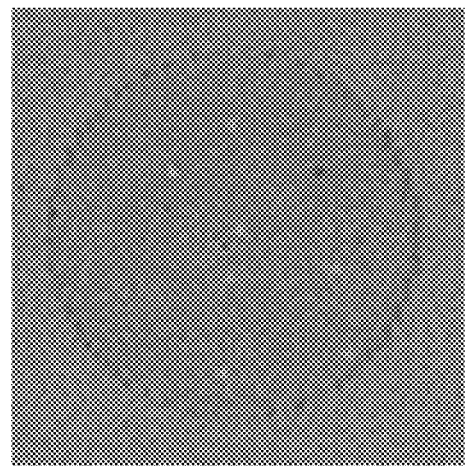
FIG. 7 is a simulated display image after optimizing a density of a second reflection portion and a density of a first reflection portion.

Referring to FIG. 7, FIG. 7 is a simulated display image of the second reflection portion and the first reflection portion after optimizing their densities. After optimizing, various data are: a percentage of a unit area of the second reflection portion 132 located in the main display area 103 is 54.78%; a percentage of a unit area of the first reflection portion 131 located in the driving circuit island area of the second sub-transition area 102B is 43.49%, a percentage of a unit area of the third reflection portions 133 located in the non-driving island area of the second sub-transition area 102B is 54.78%, a percentage of a unit area of the fourth reflection portions 134 located in the first sub-transition area 102A is 54.78%. Additionally, in the experiments for the above data, the percentages of the brightness difference before and after each area measured by the inventors are all within 5%. The display brightness of the transition display area 102 and that of the main display area tend to be identical. Except the different proportions of the unit area of each reflection portion of the display panel in FIG. 5 and FIG. 4, the other structures, experimental conditions and measuring instruments in the process of experimental demonstration are consistent. The precision instruments commercially available on the market have little effect on the brightness measurement, and the influence of different types of the precision instruments can be ignored. The above two experiments are both images displayed under 255 gray scale conditions.

One embodiment of the present application further provides a display device including the display panel 100 in the above embodiments and a photosensitive element. The photosensitive element is disposed correspondingly to the transparent display area 101 of the display panel 100. The transparent element may be disposed on one side of the substrate 10 away from the light emitting device layer. The photosensitive element may be a camera, or other photosensitive elements required to be placed in the display area.

A plurality of first reflection portions disposed on the driving circuit islands of at least the pixels in the transition display area, and a plurality of second reflection portions disposed in the main display area of the display panel render the reflectivity in the main display area and the reflectivity in the driving circuit island area tend to be uniform, so as to increase the uniformity of the display of the display panel.

It can be understood that, for those of ordinary skill in the art, equivalent replacements or modifications can be made according to the technical solution and the inventive concept of the present application, and all these replacements or modifications shall fall within the protection scope of the appended claims in the present application.

What is claimed is:

1. A display panel, comprising a main display area, a transparent display area, and a transition display area disposed between the main display area and the transparent display area, wherein the display panel includes:
    a plurality of first pixels located in the main display area;
    a plurality of second pixels located in the transparent display area and the transition display area;
    a plurality of first pixel driving circuits located in the main display area and configured to drive the plurality of first pixels;
    a plurality of second pixel driving circuits located in the transition display area and forming a plurality of driving circuit islands for driving the plurality of second pixels; and
    a reflector including a plurality of first reflection portions located on the driving circuit islands and a plurality of second reflection portions located in the main display area, a percentage of a unit area of the second reflection portion is A, a percentage of a unit area of the first reflection portion is B,
    wherein an absolute value of a difference value between A and B is less than or equal to 11.29%; a material of the reflector includes any one of a laminated ITO/Ag/ITO composite film layer, a laminated Ti/Al/Ti composite film layer, and a molybdenum metal layer.

2. The display panel according to claim 1, wherein a brightness difference between the transition display area and the main display area is less than 0.5%.

3. The display panel according to claim 1, wherein the transition display area includes a first sub-transition area and a second sub-transition area, the first sub-transition area is disposed between the second sub-transition area and the transparent display area, the second sub-transition area is disposed between the main display area and the first sub-transition area, the second sub-transition area includes a driving circuit island area for providing with the plurality of driving circuit islands, and a non-driving circuit island area between the driving circuit islands; wherein,
    the reflector further includes a plurality of third reflection portions located in the non-driving circuit island area and a plurality of fourth reflection portions located in the first sub-transition area, a percentage of a unit area of the third reflection portions is C, a percentage of a unit area of the fourth reflection portions is D, wherein an absolute value of a difference value between A and C is less than 2%, an absolute value of a difference value between A and D is less than 2%, and an absolute value of a difference value between C and D is less than 2%.

4. The display panel according to claim 3, wherein a boundary of the transparent display area close to the first sub-transition area is an arc boundary, a boundary of the first sub-transition area close to the second sub-transition area includes two opposite first arc boundaries, a boundary of the second sub-transition area close to the main display area includes two opposite second arc boundaries, and each of the first arc boundaries has a curvature less than a curvature of each of the second arc boundaries.

5. The display panel according to claim 3, wherein a pattern of the second reflection portions, a pattern of the first reflection portions, a pattern of the third reflection portions, and a pattern of the fourth reflection portions are same as or similar to each other.

6. The display panel according to claim 3, wherein the plurality of second reflection portions are distributed by equal spacings, the plurality of first reflection portions are distributed by equal spacings, the plurality of third reflection portions are distributed by equal spacings, and the plurality of fourth reflection portions are distributed by equal spacings.

7. The display panel according to claim 1, wherein the reflector is disposed between the first pixels and the first pixel driving circuits, and between the second pixels and the second pixel driving circuits; at least a part of the second reflection portions electrically connects the first pixel driving circuits and the first pixels; and at least a part of the first reflection portions electrically connects the second pixel driving circuits and the second pixels.

8. The display panel according to claim 7, wherein
the first pixel driving circuit and the second pixel driving circuit include: a first metal layer including a source electrode and a drain electrode of the first pixel driving circuit, and a source electrode and a drain electrode of the second pixel driving circuit;
the first pixel and the second pixel include: an anode layer disposed on the first metal layer, wherein the anode layer forms a first anode and a second anode; wherein,
the reflector is disposed between the anode layer and the first metal layer, a part of the second reflection portions of the reflector electrically connects the first anode and the source electrode or the drain electrode of the first pixel driving circuit, and a part of the first reflection portions of the reflector electrically connects the second anode and the source electrode or the drain electrode of the second pixel driving circuit.

9. A display panel, including a main display area, a transparent display area, and a transition display area disposed between the main display area and the transparent display area, wherein the display panel includes:
a plurality of first pixels located in the main display area;
a plurality of second pixels located in the transparent display area and the transition display area;
a plurality of first pixel driving circuits located in the main display area and configured to drive the plurality of first pixels;
a plurality of second pixel driving circuits located in the transition display area and forming a plurality of driving circuit islands for driving the plurality of second pixels; and
a reflector including a plurality of first reflection portions located on the driving circuit islands;
wherein the reflector further includes a plurality of second reflection portions located in the main display area, a percentage of a unit area of the second reflection portions is A, a percentage of a unit area of the first reflection portions is B, and an absolute value of a difference value between A and B is less than or equal to 11.29%.

10. The display panel according to claim 9, wherein a brightness difference between the transition display area and the main display area is less than 0.5%.

11. The display panel according to claim 9, wherein the transition display area includes a first sub-transition area and a second sub-transition area, the first sub-transition area is disposed between the second sub-transition area and the transparent display area, the second sub-transition area is disposed between the main display area and the first sub-transition area, the second sub-transition area includes a driving circuit island area for providing with the plurality of driving circuit islands, and a non-driving circuit island area between the driving circuit islands; wherein,
the reflector further includes a plurality of third reflection portions located in the non-driving circuit island area and a plurality of fourth reflection portions located in the first sub-transition area, a percentage of a unit area of the third reflection portions is C, a percentage of a unit area of the fourth reflection portions is D, wherein an absolute value of a difference value between A and C is less than 2%, an absolute value of a difference value between A and D is less than 2%, and an absolute value of a difference value between C and D is less than 2%.

12. The display panel according to claim 11, wherein a boundary of the transparent display area close to the first sub-transition area is an arc boundary, a boundary of the first sub-transition area close to the second sub-transition area includes two opposite first arc boundaries, a boundary of the second sub-transition area close to the main display area includes two opposite second arc boundaries, and each of the first arc boundaries has a curvature less than a curvature of each of the second arc boundaries.

13. The display panel according to claim 11, wherein a pattern of the second reflection portions, a pattern of the first reflection portions, a pattern of the third reflection portions, and a pattern of the fourth reflection portions are same as or similar to each other.

14. The display panel according to claim 11, wherein the plurality of second reflection portions are distributed by equal spacings, the plurality of first reflection portions are distributed by equal spacings, the plurality of third reflection portions are distributed by equal spacings, and the plurality of fourth reflection portions are distributed by equal spacings.

15. The display panel according to claim 9, wherein the reflector is disposed between the first pixels and the first pixel driving circuits, and between the second pixels and the second pixel driving circuits, at least a part of the second reflection portions electrically connects the first pixel driving circuits and the first pixels, and at least a part of the first reflection portions electrically connects the second pixel driving circuits and the second pixels.

16. The display panel according to claim 15, wherein
the first pixel driving circuit and the second pixel driving circuit include: a first metal layer including a source electrode and a drain electrode of the first pixel driving circuit, and a source electrode and a drain electrode of the second pixel driving circuit;
the first pixel and the second pixel include: an anode layer disposed on the first metal layer, wherein the anode layer forms a first anode and a second anode; wherein,
the reflector is disposed between the anode layer and the first metal layer, a part of the second reflection portions of the reflector electrically connects the first anode and the source electrode or the drain electrode of the first pixel driving circuit, and a part of the first reflection portions of the reflector electrically connects the second anode and the source electrode or the drain electrode of the second pixel driving circuit.

17. The display panel according to claim 9, wherein a material of the reflector includes any one of a laminated ITO/Ag/ITO composite film layer, a laminated Ti/Al/Ti composite film layer, and a molybdenum metal layer.

18. The display panel according to claim 9, wherein the reflector is disposed on a same layer as a source and a drain of the first pixel driving circuits and a source and a drain of the second pixel driving circuits.

19. The display panel according to claim 18, wherein the display panel comprises:
an active layer comprising a semiconductor layer of the first pixel driving circuits and a semiconductor layer of the second pixel driving circuits;
a first metal layer disposed on the active layer, comprising a gate of the first pixel driving circuits and a gate of the second pixel driving circuits; and
a second metal layer and the reflector disposed on a same layer and disposed on the first metal layer, wherein the second metal layer comprises the source and the drain of the first pixel driving circuits and the source and the drain of the second pixel driving circuits.

20. A display device, including a display panel and a photosensitive element, wherein the photosensitive element is disposed correspondingly to a transparent display area of the display panel, wherein the display panel includes a main display area, a transparent display area, and a transition display area disposed between the main display area and the transparent display area, wherein the display panel includes:
a plurality of first pixels located in the main display area;
a plurality of second pixels located in the transparent display area and the transition display area;
a plurality of first pixel driving circuits located in the main display area and configured to drive the plurality of first pixels;
a plurality of second pixel driving circuits located in the transition display area and forming a plurality of driving circuit islands for driving the plurality of second pixels; and
a reflector including a plurality of first reflection portions located on the driving circuit islands;
wherein the reflector further includes a plurality of second reflection portions located in the main display area, a percentage of a unit area of the second reflection portion is A, a percentage of a unit area of the first reflection portion is B, wherein an absolute value of a difference value between A and B is less than or equal to 11.29%.

\* \* \* \* \*